United States Patent
Palanduz

(10) Patent No.: US 7,453,144 B2
(45) Date of Patent: Nov. 18, 2008

(54) THIN FILM CAPACITORS AND METHODS OF MAKING THE SAME

(75) Inventor: Cengiz A. Palanduz, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 43 days.

(21) Appl. No.: 11/172,544

(22) Filed: Jun. 29, 2005

(65) Prior Publication Data

US 2007/0001259 A1    Jan. 4, 2007

(51) Int. Cl.
   *H01L 23/12* (2006.01)
   *H01L 23/053* (2006.01)
(52) U.S. Cl. .............. 257/700; 257/703; 257/E23.009; 257/E23.057
(58) Field of Classification Search .......... 257/295, 257/310, 532, 535, 700, 703, 924, E27.048, 257/E29.342, E29.343, E23.057
   See application file for complete search history.

(56) References Cited

U.S. PATENT DOCUMENTS

| | | | |
|---|---|---|---|
| 4,241,378 A | 12/1980 | Dorrian | |
| 4,458,295 A | 7/1984 | Durschlag et al. | |
| 4,528,613 A | 7/1985 | Stetson et al. | |
| 4,687,540 A | 8/1987 | Singhdeo et al. | |
| 4,702,967 A | 10/1987 | Black et al. | |
| 5,065,275 A | 11/1991 | Fujisaki et al. | |
| 5,155,655 A | 10/1992 | Howard et al. | |
| 5,160,762 A | 11/1992 | Brand et al. | |
| 5,172,304 A | 12/1992 | Ozawa et al. | |
| 5,177,670 A | 1/1993 | Shinohara et al. | |
| 5,191,510 A | 3/1993 | Huffman | |
| 5,206,788 A * | 4/1993 | Larson et al. | 361/313 |

(Continued)

FOREIGN PATENT DOCUMENTS

EP    0977218 A2    2/2000

(Continued)

OTHER PUBLICATIONS

Offerman, SE, et al: "Grain Nucleation and Growth During Phase Transformations," Science (2002) 298-1003-1005.

(Continued)

*Primary Examiner*—Minh-Loan Tran
*Assistant Examiner*—Leslie Pilar Cruz
(74) *Attorney, Agent, or Firm*—Blakely, Sokoloff, Taylor & Zafman LLP

(57) ABSTRACT

An apparatus including a first electrode; a second electrode; a first and second ceramic material disposed between the first electrode and the second electrode, the second ceramic material having a greater electrical conductivity than the first ceramic material. A method including forming a first ceramic material film and a different second ceramic material film on a first electrode; and forming a second electrode on the second ceramic material film to form a capacitor structure having the first ceramic material film and the second ceramic material film disposed between the first electrode and the second electrode, wherein the first ceramic material has a conductivity selected to dampen undesired oscillations in electrical device operation to which the capacitor structure may be exposed. An apparatus including a first electrode; a second electrode; and a composite dielectric including a plurality of dielectric films including a different Curie temperature.

14 Claims, 7 Drawing Sheets

U.S. PATENT DOCUMENTS

| | | | |
|---|---|---|---|
| 5,504,993 | A | 4/1996 | Szerlip et al. |
| 5,745,334 | A | 4/1998 | Hoffarth et al. |
| 5,796,572 | A | 8/1998 | Kawai |
| 5,800,575 | A | 9/1998 | Lucas |
| 5,889,647 | A | 3/1999 | Hansen et al. |
| 5,912,044 | A | 6/1999 | Farooq et al. |
| 5,952,040 | A | 9/1999 | Yadav et al. |
| 5,978,207 | A * | 11/1999 | Anderson et al. ........... 361/311 |
| 6,043,973 | A | 3/2000 | Nagashima et al. |
| 6,058,004 | A | 5/2000 | Duva et al. |
| 6,178,082 | B1 | 1/2001 | Farooq et al. |
| 6,216,324 | B1 | 4/2001 | Farooq et al. |
| 6,226,172 | B1 | 5/2001 | Sato et al. |
| 6,351,368 | B1 | 2/2002 | Kim |
| 6,372,286 | B1 | 4/2002 | Azuma et al. |
| 6,433,993 | B1 | 8/2002 | Hunt et al. |
| 6,437,970 | B1 | 8/2002 | Lee et al. |
| 6,477,034 | B1 | 11/2002 | Chakravorty et al. |
| 6,524,352 | B2 | 2/2003 | Adae-Amoakoh et al. |
| 6,541,137 | B1 | 4/2003 | Kingon et al. |
| 6,617,681 | B1 | 9/2003 | Bohr |
| 6,623,865 | B1 | 9/2003 | Zou et al. |
| 6,631,551 | B1 | 10/2003 | Bowles et al. |
| 6,638,378 | B2 | 10/2003 | O'Bryan et al. |
| 6,672,912 | B2 | 1/2004 | Figueroa |
| 6,775,150 | B1 | 8/2004 | Chakravorty et al. |
| 6,795,296 | B1 | 9/2004 | Palanduz et al. |
| 6,891,258 | B1 | 5/2005 | Alexander et al. |
| 6,907,658 | B2 | 6/2005 | Li |
| 6,937,035 | B2 | 8/2005 | Kawaike et al. |
| 6,980,416 | B2 | 12/2005 | Sakaguchi et al. |
| 7,038,235 | B2 | 5/2006 | Seitz |
| 7,072,167 | B2 | 7/2006 | Borland |
| 2001/0019144 | A1 | 9/2001 | Roy |
| 2001/0054748 | A1* | 12/2001 | Wikborg et al. ............. 257/595 |
| 2002/0080551 | A1* | 6/2002 | Kitagawa et al. ............ 361/302 |
| 2002/0175402 | A1 | 11/2002 | McCormack et al. |
| 2003/0016026 | A1 | 1/2003 | Kawaike et al. |
| 2003/0136997 | A1 | 7/2003 | Shioga et al. |
| 2003/0170432 | A1 | 9/2003 | Kobayashi et al. |
| 2003/0184953 | A1* | 10/2003 | Lee et al. ..................... 361/312 |
| 2003/0207150 | A1 | 11/2003 | Maria et al. |
| 2003/0230768 | A1 | 12/2003 | Seitz |
| 2004/0027813 | A1 | 2/2004 | Li |
| 2004/0081811 | A1 | 4/2004 | Casper et al. |
| 2004/0089471 | A1 | 5/2004 | Andoh et al. |
| 2004/0126484 | A1 | 7/2004 | Croswell et al. |
| 2004/0175585 | A1 | 9/2004 | Zou et al. |
| 2004/0257749 | A1 | 12/2004 | Otsuka et al. |
| 2005/0011857 | A1 | 1/2005 | Borland et al. |
| 2005/0118482 | A1* | 6/2005 | Sriramulu et al. ............. 429/34 |
| 2005/0151156 | A1* | 7/2005 | Wu et al. ..................... 257/107 |
| 2005/0213020 | A1* | 9/2005 | Takeda et al. ............... 349/182 |
| 2006/0099803 | A1 | 5/2006 | Yongki |
| 2006/0143886 | A1 | 7/2006 | Srinivasan et al. |

FOREIGN PATENT DOCUMENTS

| | | |
|---|---|---|
| JP | 02-005507 | 1/1990 |
| JP | 03/178112 | 8/1991 |
| JP | 07122456 | 12/1995 |
| JP | 2002-297939 | 10/2001 |
| JP | 2002-305125 | 10/2002 |

OTHER PUBLICATIONS

Felten, J, et al.: "Embedded Ceramic Resistors and Capacitors in PWB: Process and Performance"; http://edc.ncms.org/ (2004) 7 pages.

Ohly, C. et al., "Defects in alkaline earth titanate thin films—the conduction behavior of doped BST," Integrated Ferroelectrics, 2001, vol. 38, pp. 229-237.

Ohly, C. et al., "High termperature conductivity behavior of doped SrTiO3 thin films," Integrated Ferroelectrics, 2001, vol. 33, pp. 363-372.

Ohly, C. et al., "Electrical conductivity and segregation effects of doped SrTiO3 thin films," Journal of European Ceramic Society, 21 (2001) 1673-1676.

PCT Search Report and Written Opinion for PCT Appln. No. PCT/US2005/037626, mailed May 8, 2006 (9 pages).

Office Action for U.S. Appl. No. 10/974,139, mailed Dec. 13, 2006 (11 pages).

Office Action for U.S. Appl. No. 10/971,829, mailed Jan. 3, 2007 (8 pages).

Office Action for U.S. Appl. No. 10/976,425, mailed Mar. 26, 2007 (7 pgs).

Office Action for U.S. Appl. No. 10/974,139, mailed Apr. 17, 2007 (13 pgs).

Office Action for U.S. Appl. No. 11/096,313, mailed May 31, 2007 (16 pgs).

Imanaka, Yoshihiko et al., "Decoupling Capacitor with Low Inductance for High-Frequency Digital Applications," FUJITSU Sci. Tech. J., 38, 1, Jun. 2002, pp. 22-30.

Nagata, Hirotoshi et al., "Improvement of Bonding Strength Between Au/Ti and SiO$_2$ Films by Si Layer Insertion," J. Vac. Sci. Technol. A 17(3), May/Jun. 1999, pp. 1018-1023.

Office Action for U.S. Appl. No. 10/882,745, mailed Mar. 17, 2005 (12 pgs).

Office Action for U.S. Appl. No. 10/882,745, mailed Oct. 4, 2005 (10 pgs).

Office Action for U.S. Appl. No. 10/882,745, mailed Apr. 3, 2006 (9 pgs).

Office Action for U.S. Appl. No. 10/882,745, mailed Aug. 30, 2006 (12 pgs).

Office Action for U.S. Appl. No. 10/882,745, mailed Jan. 10, 2007 (13 pgs).

Office Action for U.S. Appl. No. 10/882,745, mailed May 1, 2007 (12 pgs).

Office Action for U.S. Appl. No. 10/971,829, mailed Mar. 8, 2006 (8 pgs).

Office Action for U.S. Appl. No. 10/971,829, mailed Aug. 14, 2006 (8 pgs).

Office Action for U.S. Appl. No. 10/974,139, mailed Mar. 9, 2006 (10 pgs).

Office Action for U.S. Appl. No. 111/096,313, mailed Aug. 14, 2006 (10 pgs).

Office Action for U.S. Appl. No. 11/096,313, mailed Nov. 29, 2006 (12 pgs).

Office Action for U.S. Appl. No. 11/096,313, mailed Feb. 20, 2007 (4 pgs).

PCT International Search Report dated Nov. 4, 2005, PCT/US2005/022356, filed Jun. 23, 2005.

Article on the web on Answers.com about different ceramic material from Wikipedia <http://www.answers.com/topic/ceramics?cat=technology> (7 pages).

Voisard, Cyril et al., "Electrical Conductivity of Strontium Bismuth Titanate under Controlled Oxygen Partial Pressure," Journal of the European Ceramic Society, 19, 1999, pp. 1251-1254.

Yoo, Han-III et al., "Defect Structure and Chemical Diffusion in BaTiO3," Solid State Ionics 135, 2000, pp. 619-623.

Office Action for U.S. Appl. No. 10/974,139, mailed Oct. 9, 2007 (14 pgs).

Office Action for U.S. Appl. No. 10/882,745, mailed Jan. 16, 2008 (12 pages).

Office Action for U.S. Appl. No. 10/096,315, mailed Jan. 25, 2008 (24 pages).

Intel Corporation, "International Preliminary Report on Patentability (IPRP Chapter I) mailed Jan. 18, 2007", PCT/US2005/022356.

Intel Corporation, "International Preliminary Report on Patentability (IPRP Chapter I) mailed May 3, 2007", PCT/US2005/037626.

Intel Corporation, "International Preliminary Report on Patentability (IPRP Chapter I) mailed Oct. 11, 2007", PCT/US2006/012587.

Intel Corporation, "Office Action mailed Jan. 25, 2008", U.S. Appl. No. 11/096,315, 24 pages.

Intel Corporation, "Office Action mailed Oct. 10, 2007", U.S. Appl. No. 11/172,544, 16 pages.

Intel Corporation, "Office Action mailed Oct. 18, 2007", U.S. Appl. No. 11/096,313, 19 pages.

Intel Corporation, "Office Action mailed Oct. 9, 2007", U.S. Appl. No. 10/974,139, 14 pages.

Intel Corporation, "Office Action mailed Sep. 26, 2007", U.S. Appl. No. 10/976,425, 10 pages.

Intel Corporation, "Office Action mailed Sep. 27, 2007", U.S. Appl. No. 10/882,745, 15 pages.

Intel Corporation, "PCT Search Report and Written Opinion dated May 8, 2006", PCT/US2005/037626.

Intel Corporation, "PCT Search Report dated Aug. 1, 2006", PCT/US2006/012587.

Intel Corporation, Office Action mailed Jun. 12, 2008; U.S. Appl. No. 10/976,425.

Intel Corporation, Final Office Action mailed Jun. 20, 2008; U.S. Appl. No. 11/096,315.

* cited by examiner

THIN FILM CAPACITORS AND METHODS OF MAKING THE SAME

BACKGROUND

1. Field

Integrated circuit structure and packaging.

2. Background

It is desirable to provide decoupling capacitance in a close proximity to an integrated circuit chip or die. The need for such capacitance increases as the switching speed and current requirements of chips or dies becomes higher. One way to provide decoupling capacitance through a chip or die is through an interposer substrate between a chip and a package that includes one or more thin film capacitors. Utilizing an interposer substrate between a chip and a package substrate allows capacitance to be proximate to a chip without utilizing real estate on a chip or an associated substrate package. Such configuration tends to improve the capacitance on power supply lines for the chip. A second way to provide decoupling capacitance is by integrating one or more thin film capacitors into a package substrate.

BRIEF DESCRIPTION OF THE DRAWINGS

Features, aspects, and advantages of embodiments will become more thoroughly apparent from the following detailed description, appended claims, and accompanying drawings in which:

DETAILED DESCRIPTION

Figure 1:
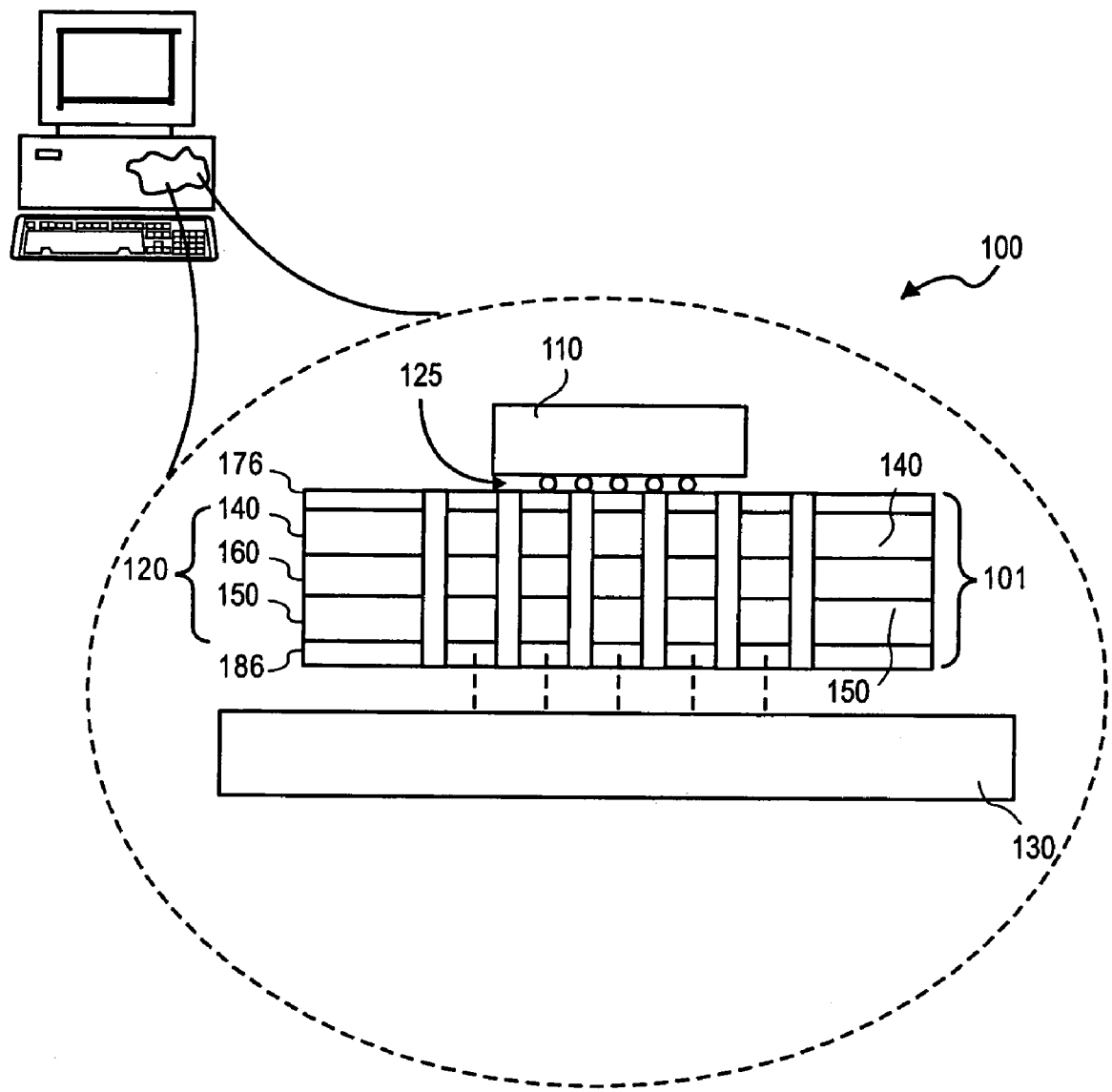
FIG. 1 shows a cross-sectional view of a package substrate located between a die and a base substrate.

FIG. 1 shows a cross-sectional side view of an integrated circuit package that can be physically and electrically connected to a printed wiring board or printed circuit board (PCB) to form an electronic assembly. The electronic assembly can be part of an electronic system such as a computer (e.g., desktop, laptop, hand-held, server, etc.), wireless communication device (e.g., cellular phone, cordless phone, pager, etc.), computer-related peripheral (e.g., printers, scanner, monitors, etc.), entertainment device (e.g., television, radio, stereo, tape and compact disc player, videocassette recorder, MP3 (Motion Picture Experts Group, Audio Layer 3) player, etc.), and the like. FIG. 1 illustrates the package as part of a desktop computer.

FIG. 1 shows electronic assembly 100 including die 110 physically and electrically connected to package substrate 101. Die 110 is an integrated circuit die, such as a processor die. Electrical contact points (e.g., contact pads on a surface of die 110) are connected to package substrate 101 through conductive bump layer 125. Package substrate 101 may be used to connect electronic assembly 100 to printed circuit board 130, such as a motherboard or other circuit board.

In one embodiment, package substrate 101 includes one or more embedded capacitor structures. Referring to FIG. 1, package substrate 101 includes capacitor structure 140 connected to one side of core substrate 160. Capacitor structure 150 is connected to an opposite side of core substrate 160. In one embodiment, core substrate 160 is an organic core such as an epoxy including a fiberglass reinforced material, also called pre-preg. This configuration may be referred to as an integrated thin film capacitor (iTFC) system, where the capacitor(s) is(are) integrated into the package substrate rather than, for example, an interposer between the die and the package substrate. Overlying capacitor structure 140 is build-up layer 176 of, for example, a polymer dielectric such as silica particle-filled epoxy. Underlying capacitor structure 150 is build-up layer 186. Each build-up layer may include conductive vias and traces (e.g., copper traces) for lateral translation of contact points between die 110 and package substrate 101, and package substrate 101 and printed circuit board 130, respectively. Metal layers in the build-up layer are separated by polymer dielectric layers made up of, for example, silica particle-filled epoxy. The region made up of the combination of layers 186, 150, 160, 140 and 176, respectively, is referred to herein as functional core 120.

Figure 2:
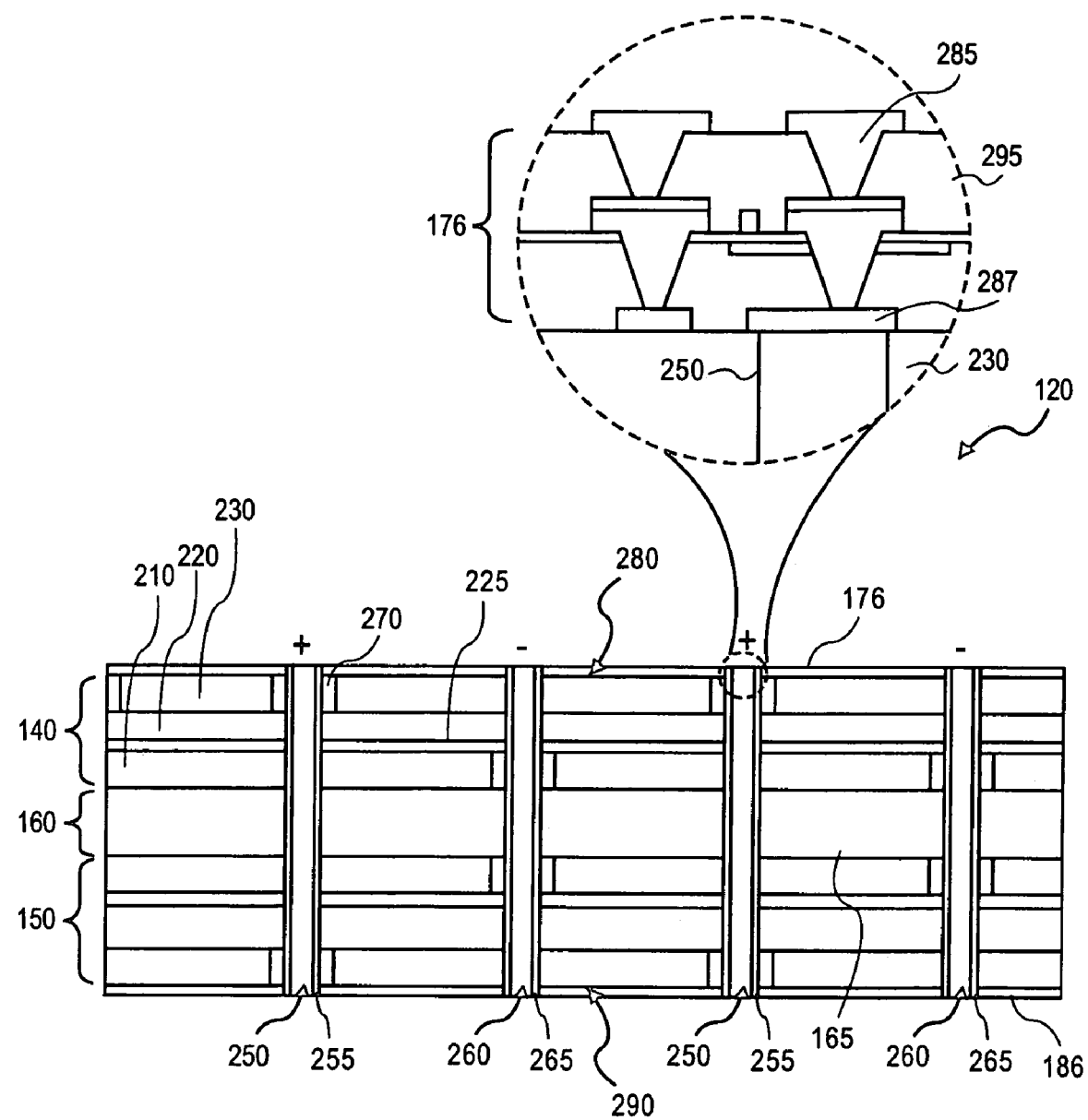
FIG. 2 shows a magnified view of a portion of a package substrate of FIG. 1.

FIG. 2 shows a magnified view of a portion of functional core 120. Functional core 120 includes core substrate 160 having a thickness, in one embodiment, on the order of 200 microns (µm) to 700 µm. In another embodiment, core substrate 160 has a thickness on the order of 200 µm to 300 µm. In one embodiment, core substrate 160 is a glass-fiber (silica) reinforced epoxy.

Capacitor structure 140 is connected to one side of core substrate 160 (a top side as viewed). Capacitor structure 140 includes first conductor 210 proximate to core substrate 160 and second conductor 230. Disposed between first conductor 210 and second conductor 230 is high k dielectric material 220. Capacitor structure 150 is connected to an opposite side of core substrate 160 (a bottom side as viewed) and has a similar configuration of a dielectric material disposed between two conductors. Overlying capacitor structure 140 and capacitor structure 150 of functional core 120 (on sides opposite sides facing core substrate 160) is build-up layer 176 and build-up layer 186, respectively. The build-up layers may include conductive vias, traces and contact points to connect package substrate to a chip or die and to a printed circuit board, respectively. An inset in FIG. 2 shows build-up layer 176 including two levels of conductive vias 285 and traces 287 disposed in dielectric material 295 of, for example, silica particle-filled epoxy.

In one embodiment, first conductor 210 and second conductor 230 of capacitor structure 140 are electrically conductive material. Suitable materials include, but are not limited to, a nickel or a copper material. A representative thickness of first conductor 210 and second conductor 220 is on the order of 10 μm to 50 μm.

In one embodiment, dielectric material 220 is a ceramic material having a relatively high dielectric constant (high-k). Representatively, a high-k material is a ceramic material having a dielectric constant on the order of 100 to 1,000. Suitable materials for dielectric material 220 include, but are not limited to, barium titanate ($BaTiO_3$), barium strontium titanate (Ba, Sr) $TiO_3$), and strontium titanate ($SrTiO_3$). A representative thickness of dielectric material 220 of a high-k ceramic material of a thickness on the order of 1 μm and, in another embodiment, less than 1 μm. Capacitor structure 150, in one embodiment, is similar to capacitor structure 140.

FIG. 2 also shows attenuation layer 225 on a surface of first conductive layer 210 between first conductive layer 210 and dielectric material 220 of capacitor 140. A similar attenuation layer may be disposed on at least one conductive layer between the conductive layer and the dielectric material utilized in capacitor 150. In one embodiment, attenuation layer 225 is a ceramic material that has a greater electrical conductivity than dielectric material 220. In one embodiment, the electrical conductivity of attenuation layer 225 is selected to affect unwanted oscillations in electrical device operation, such as providing a dampening effect. In essence, attenuation layer 225 may act as a resistor on first conductive layer 210. Resonance typically occurs at a frequency where the impedance peaks. If an equivalent self-resistance of a thin film capacitor is increased and tuned for a critical value at which resonance can be suppressed, then the relative magnitude of the impedance peak is lowered. Physically, the resonating electromagnetic energy is converted into heat and hence the amplitude of the oscillation is attenuated.

A suitable material for attenuation layer 225 includes a ferroelectric material such as lanthanum strontium manganese oxide ((La, Sr) $MnO_3$). An example is $La_{1-x}SrMnO_{3-\delta}$ where x ranges from 0.0 to 0.4. The electrical conductivity of $La_{1-x}Sr_xMnO_{3-\delta}$ (at room temperature) changes from less than one siemans per centimeter (S/cm) to above 1000 S/cm by changing x from 0.0 to 0.4. For different values of sintering conditions (partial pressure oxygen, temperature) and different values of x, δ will have different values based on the equilibrium thermodynamics. A suitable thickness for attenuation layer 225 would be on the order of 10 angstroms to angstroms.

FIG. 2 shows a number of vias extending through functional core 120 between surface 280 and surface 290. Representatively, via 250 and via 260 are lined with electrically conductive materials 255 and 265 (e.g., a copper material), respectively, of suitable polarity to be connected to power or ground contact points of die 110 (e.g., through conductive bump layer 125 to contact pads on die 110 of FIG. 1). In one embodiment, vias 250 and vias 260 extend through capacitor structure 140, core substrate 160, and capacitor structure 150. In addition to the conductive material lining, each via may include a plug resin that fills the vias. Electrically conductive portions of vias 250 and vias 260 may be insulated, where desired, from portions of capacitor structure 140 or capacitor structure 150 by sleeves 270 of a dielectric material.

Figure 3:
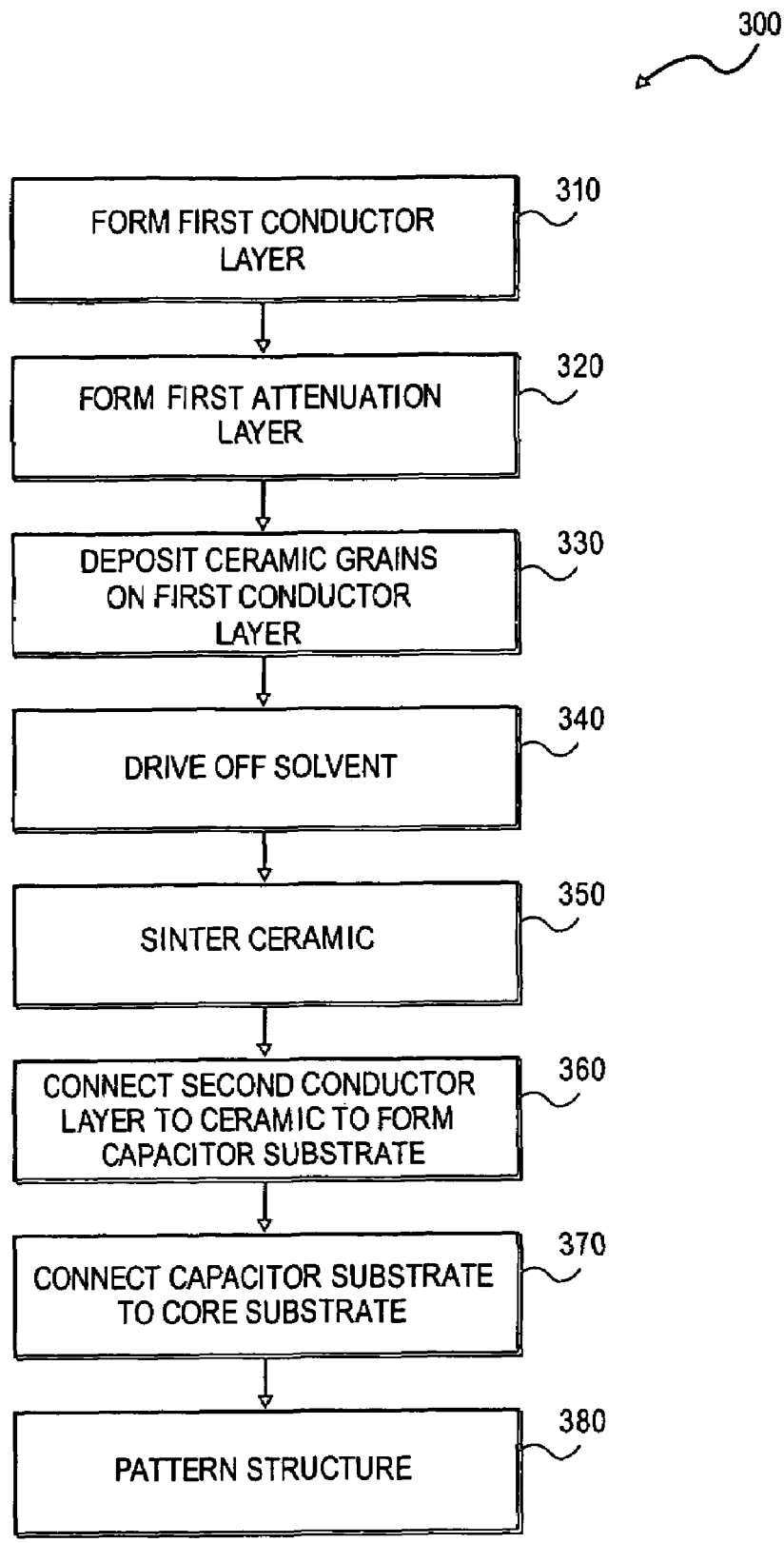
FIG. 3 shows a flow chart of a method of forming a capacitor.

FIG. 3 shows one technique for forming capacitor structure 140. Referring to FIG. 3, method or technique 300 includes initially forming a first conductive layer at block 310. Representatively, a first conductive layer, such as first conductive layer 210 of FIG. 2 is a nickel or copper material that is formed as a sheet (e.g., foil) having a desired thickness. Representative thicknesses are on the order of several microns to tens of microns depending on the particular design parameters. One way a conductive layer of sheet or foil may be formed is by electroplating a material foil or layer on a removable base substrate (e.g., a polymer carrier sheet) having, for example, a conductive seed layer on a surface thereof. Alternatively, a conductive material paste (e.g., copper or nickel paste) may be deposited on the removable base substrate.

Technique or method 300 provides forming an attenuation layer on first conductive layer, block 320. An attenuation layer of a conductive ceramic such as (La, Sr) $MnO_3$, may be formed by physical vapor deposition (PVD), chemical solution deposition (CSD) or other technique or other techniques. The attenuation layer may be formed over an entire surface of the first conductive layer (e.g., a blanket deposition).

Following the formation of an attenuation layer, technique or method 300 provides depositing ceramic grains on a surface, including the entire surface, of the attenuation layer on the first conductive layer, block 330. To form a ceramic material of a thickness on the order of 0.1 to 0.2 micron, ceramic powder particles having a thickness on the order of five to 30 nanometers are deposited on the first conductive layer. One way to deposit ceramic material is through a chemical solution deposition (e.g., sol-gel) process where the metal cations are embedded in polymer chains which are dissolved in a solvent, and the solvent spun or sprayed on to the first conductive layer. Other techniques for depositing ceramic material is by chemical vapor deposition (CVD), physical vapor deposition (PVD), or laser ablation.

Referring to technique or method 300 of FIG. 3, in the embodiment where ceramic material is deposited through a solvent, such as in a sol gel process, once deposited, the deposits are dried to burn-off organic contents, block 340. Representatively, the first conductive layer having deposited ceramic grains thereon is exposed to an inert atmosphere (e.g., nitrogen) and an elevated temperature (e.g., 100 to 200° C.) to drive off the solvent and remove organic contents.

The ceramic particles are exposed to a sintering process to densify or reduce the surface energy of the ceramic particles, block 350. Representative sintering conditions for sintering a high k ceramic, such as $BaTiO_3$ is a temperature on the order of 700° C. to 900° C.

Referring to FIG. 3, following the sintering of the ceramic material, a second conductive layer may be connected (e.g., printed, electroplated) to the ceramic material to form a capacitor substrate, block 360. In the embodiment where the ceramic overlies a sheet or foil of the first conductive layer, the second conductive layer may be disposed on an opposite surface of the ceramic material. In one embodiment, the second conductive layer is a metal such as nickel or copper. In an alternate process, the second conductive layer is formed on the ceramic material prior to sintering the ceramic material. In such case, a barrier layer such as described above may be formed between the ceramic material and the second conductive layer.

In FIG. 3, block 370, the capacitor substrate may then be connected (e.g., laminated) to a core substrate such as core substrate 160. In one embodiment, a second capacitor substrate may be formed in a similar manner as provided above and connected to an opposite side of a core substrate to yield the structure shown in FIG. 3.

In FIG. 3, block 380, the integrated capacitor structure is patterned. In one embodiment, the electrode of each capacitor proximate to the core substrate is patterned before connection since once connected to the core substrate, it is typically not accessible for many patterning operations. The other electrode of each capacitor and the rest of the integrated capacitor structure may be patterned once the capacitors are connected to the core substrate. Conventional patterning operations, such as mechanical drilling, drilling via holes in epoxy with laser, lithography and copper plating operations used in via formation may be employed. The capacitor structure may also be patterned to form individual capacitors. A complete organic substrate may be formed by adding build-up layers of an organic material and conductors onto the structure.

Figure 4:
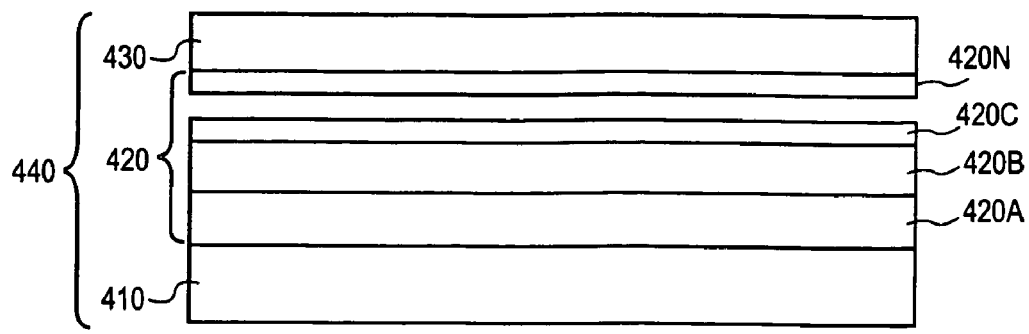
FIG. 4 shows a cross-sectional side view of an embodiment of a thin film capacitor including a composite dielectric of a number of films.

FIG. 4 shows another embodiment of a capacitor structure that might be substituted for one or both of capacitor structure 140 and capacitor structure 150 in FIG. 1. In this embodiment, capacitor structure 440 includes first conductor 410 and second conductor 430. Disposed between first conductor 410 and second conductor 430 is dielectric material 420, such as a high k ceramic material.

In one embodiment, first conductor 410 and second conductor 430 of capacitor structure 440 are electrically conductive material. Suitable conductive material includes, but is not limited to, a nickel or a copper material. A representative thickness of first conductor 410 and second conductor 430 is on the order of 10 µm to 50 µm.

Figure 5:
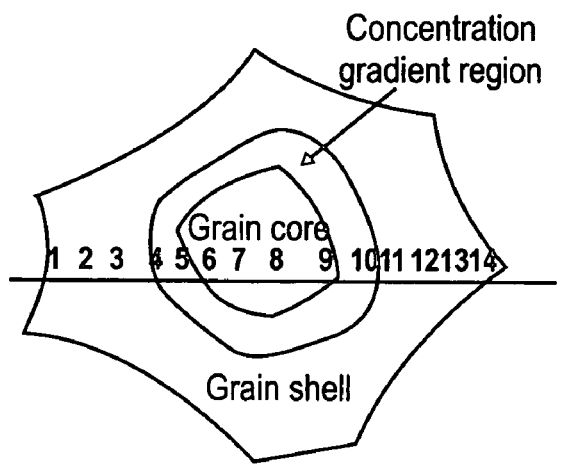
FIG. 5 shows a representation of a core-shell microstructure used in a multi-layer ceramic capacitor including a concentration profile of dopants.
Figure 6:
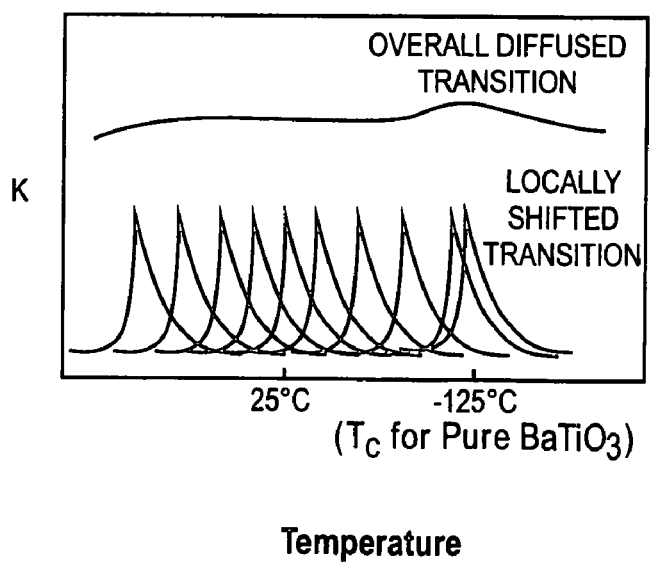
FIG. 6 graphically illustrates the diffused transition (dielectric constant versus temperature) for a X7R barium, strontium titanate dielectric material.

In one embodiment, dielectric material 420 is a composite of a number of dielectric films where each of the dielectric films have a different Curie temperature. It is generally recognized that the dielectric constant of a ceramic dielectric, such as barium titanate ($BaTiO_3$) used in capacitors, varies strongly as a function of temperature. This strong variation generally is not desirable for stable device performance, because the total impedance of the capacitor will change as the temperature changes. In multi-layer ceramic capacitors (MLCCs), the problem is addressed by starting with ceramic powders having core-shell microstructures where a concentration gradient of dopants, such as strontium, exist in each ceramic powder. For example, a ceramic material such as barium titanate ($BaTiO_3$), which is a ferroelectric compound, has a temperature-dependent variation of dielectric constant across a range of, for example, 0° C. beyond 120° C., with a sharp peak in dielectric constant at a Curie temperature ($T_c$) around 120° C. Certain dopant cations such as strontium tend to shift the Curie temperature of a host ferroelectric compound. In powder processing to form MLLCs, ceramic powders are coated with solutions that are rich in the Curie-shifting cation dopants (Curie-shifters). The powders are then heat-treated in such a way that the Curie-shifters diffuse into the grain and form a gradually varying concentration profile (high concentration on the outer surface and lean concentration in the core regions of the ceramic grains). These powders are then tape-cast into the capacitor dielectric layers and eventually sintered to obtain a microstructure with a heavy concentration of Curie-shifters at the grain boundaries, and lean concentration at the grain cores. This is called a "core-shell" microstructure and is illustrated in FIG. 5. Each ring of Curie-shifter in the ceramic grains generally has a different Curie temperature associated with it. The overall dielectric response of many such dopant rings has a relatively uniform temperature dependence as illustrated in FIG. 6.

In one embodiment, sol-gel or solution processing is used to form thin film capacitors such as capacitor structure 440. Unfortunately, the core-shell microstructure described above cannot be achieved using solution processing to form thin films. Accordingly, in one embodiment, dielectric 420 comprises a composite of individual films (e.g., film 420A, film 420B, and film 420C), each having a different concentration of a dopant that will provide the film with a Curie temperature different than other individual films. Collectively, the individual films may be assembled to produce composite dielectric 420 having, in the case of a barium titanate composite dielectric, a diffused transition such as shown in FIG. 6.

Figure 7:
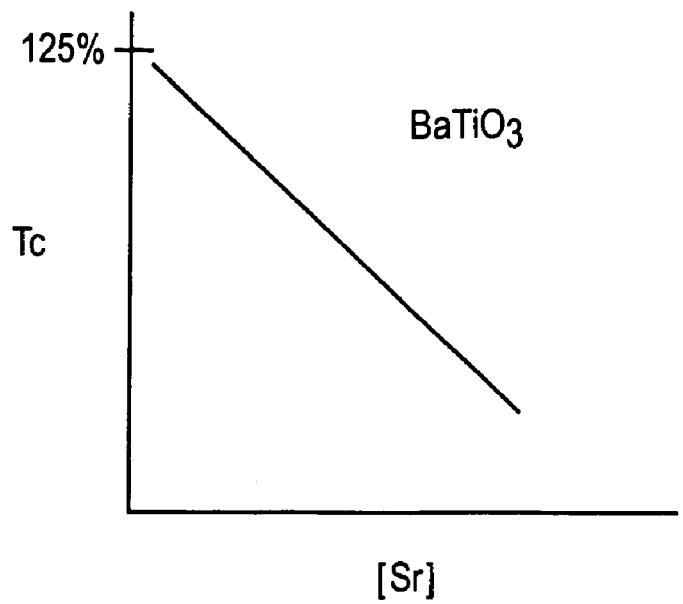
FIG. 7 graphically illustrates the effect of dopant concentration on Curie temperature of barium titanate.

In one embodiment, barium titanate is used as the ceramic material. The barium titanate may be doped with a dopant or Curie-shifter such as strontium to modify the Curie temperature of the dielectric material. In general, the amount of strontium in a barium titanate film is inversely related to the Curie temperature, so that an increase in the concentration of strontium will shift the Curie temperature of a film to a lower Curie temperature. This is graphically illustrated in FIG. 7.

In one embodiment, individual film 420A, film 420B, and film 420C have different concentrations of strontium. In one embodiment, the strontium concentration in films gradually decreases away from first conductor 410, so that film 420A has a higher concentration than film 420B, and film 420B has a strontium concentration greater than film 420C, and so on. The individual films may be formed as thin film layers using organic burnout and atmosphere-controlled firing techniques, such as described above with reference to FIG. 3 (e.g., block 330 and block 340). Each individual layer may be sintered separately or a sintering process may be conducted once each film is applied to make up composite dielectric 420.

In the above embodiment, a capacitive response of composite dielectric 420 is a series representation:

$$\frac{1}{C_{total}} = \frac{1}{C_{420A}} + \frac{1}{C_{420B}} + \frac{1}{C_{420C}} + \ldots \frac{1}{C_{420n}}$$

In another embodiment, individual dielectric films that may form a composite dielectric in a capacitor structure may be arranged in a parallel representation of capacitive response.

Figure 8:
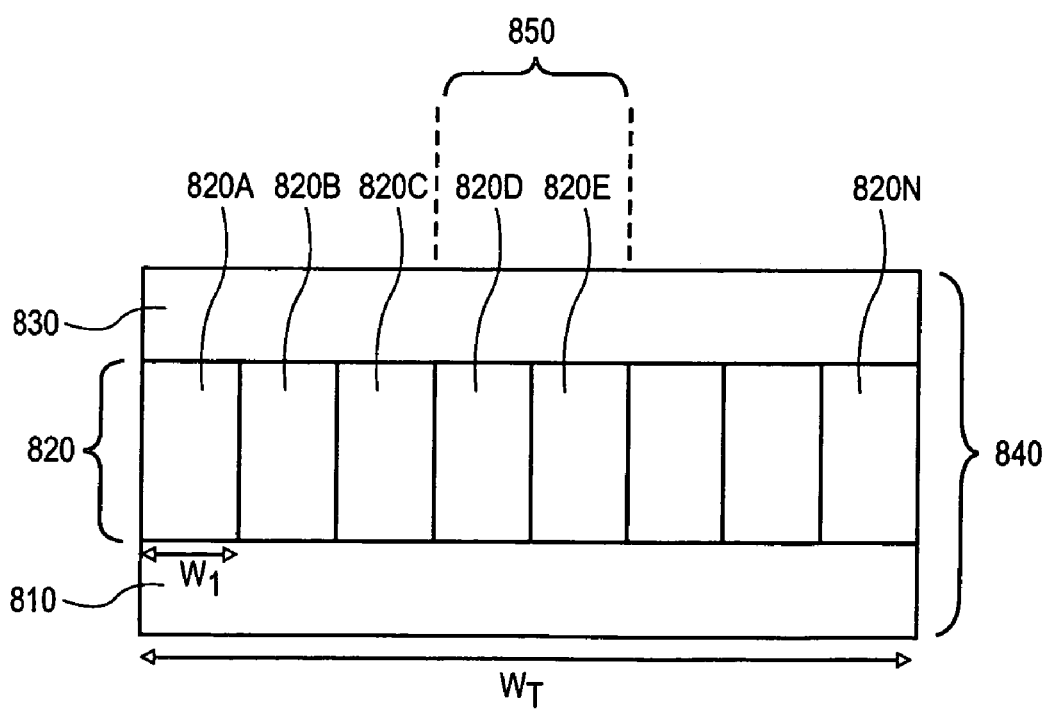
FIG. 8 shows a cross-sectional side view of another embodiment of a thin film capacitor including a composite dielectric of a number of films.

FIG. 8 shows capacitor structure 840 including first conductor 810 and second conductor 830. A material and thickness of first conductor 810 and second conductor 830 may be similar to those materials and thicknesses described above with reference to FIG. 2 and FIG. 4 and the accompanying text. Disposed between first conductor 810 and second conductor 830 is composite dielectric 820. In this embodiment, composite dielectric consists of a number of films (e.g., film 820A, film 820B, film 820C, film 820D, film 820E, . . . film 820n). Each film is arranged vertically with respect to an adjacent film as viewed. In other words, an individual film, such as film 820A does not cover an entire surface of first conductor 810 or second conductor 830. In one embodiment where first conductor 810 is rectangular, a film such as film 820A has a width, $W_I$, at one point, less than the entire width, $W_T$ of first conductor 810. A length dimension into the page, as viewed, of film 820A may be equivalent to a similar length dimension of first conductor 810. According to this embodiment, a film such as 820A may extend along one perimeter edge of first conductor 810 (a line) around an outer perimeter of first conductor 810 but extend only minimally into an area defined by a surface of first conductor 810.

Similar to composite dielectric 420 described above with reference to FIG. 4, individual films (film 820A, film 820B, film 820C, film 820D, film 820E, . . . film 820n) may have a different concentration of a dopant or Curie-shifter. In one embodiment, where the dielectric material is barium titanate and the dopant is strontium, a target diffused transition may be similar to that shown in FIG. 7. Because each film column is roughly parallel to each other as shown in FIG. 8, the contribution to the overall capacitive response would be additive.

$$C_{TOT}=C_{820A}+C_{820B}+C_{820C}+\ldots+C_{820}{}^n$$

In one embodiment, the film or films tending to have the highest Curie temperature may be located at areas of the capacitor structure that may see more heat, such as area 850 that might be closer to an electronic device, such as a die.

Figure 9:
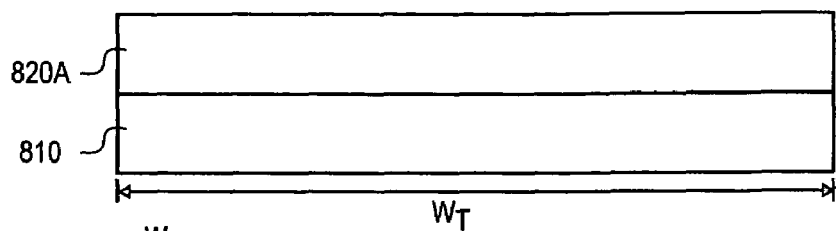
FIG. 9 shows a cross-sectional side view of a conductor for a capacitor having a material for a first dielectric film deposited across a surface.
Figure 10:
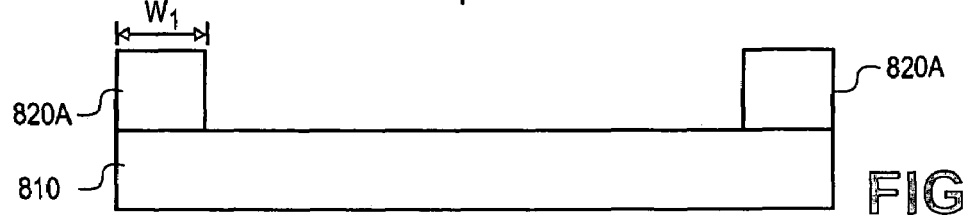
FIG. 10 shows the structure of FIG. 9 following the formation and patterning of a first film.
Figure 11:
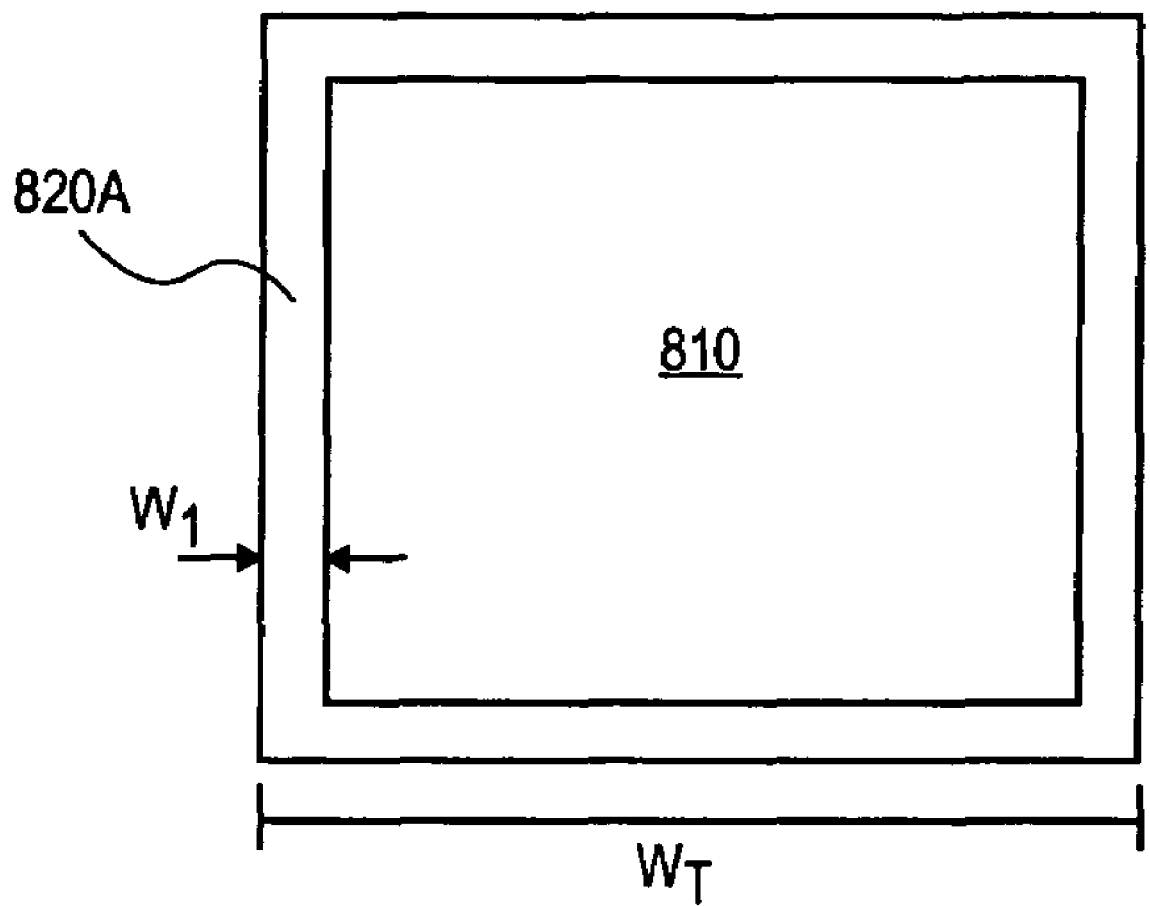
FIG. 11 shows a top view of the structure of FIG. 10.

FIGS. 9-14 describe one method of forming a capacitor structure such as the capacitor structure shown in FIG. 8. The reference numerals in FIG. 8 will be used in conjunction with FIGS. 9-14. FIG. 9 shows a material for film 820A deposited onto first conductor 810 of a nickel or copper sheet. One way to deposit a material for film 820A is through a chemical solution deposition such as described above with respect to FIG. 3 in forming a ceramic material. In such case, once deposited, the material is dried to burn-off organic contents to form film 820A. Following this, film 820A may be patterned using wet etch, dry etch, or laser ablation techniques. In one embodiment, in this cross-section, film 820A is patterned to have a width, $W_1$, and a length, into the page, equivalent to a similar length of first conductor 810. FIG. 11 shows a top view of the structure of FIG. 10 and shows film 820A extending around a perimeter of first conductor 810. It is appreciated that for a rectangular structure such as first conductor 810, film 820A may be patterned rectangularly (as shown in FIG. 11) or in a linear fashion, e.g., as a line into the page in the representation in FIG. 10 and not extending around the perimeter of first conductor 810.

Figure 12:
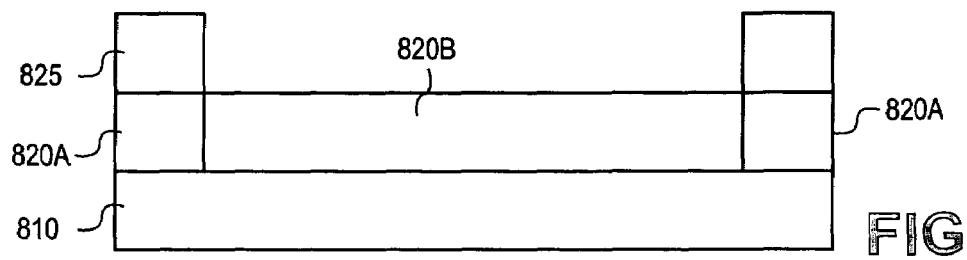
FIG. 12 shows the structure of FIG. 10 following the patterning of a mask over the first film and the deposition of a material for a second film.
Figure 13:
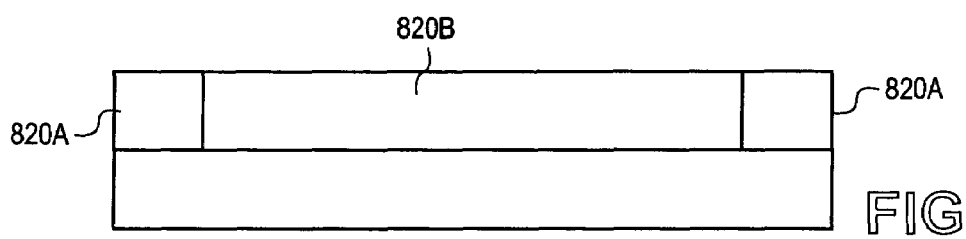
FIG. 13 shows the structure of FIG. 12 following the removal of the mask and processing of the material for the second film.
Figure 14:
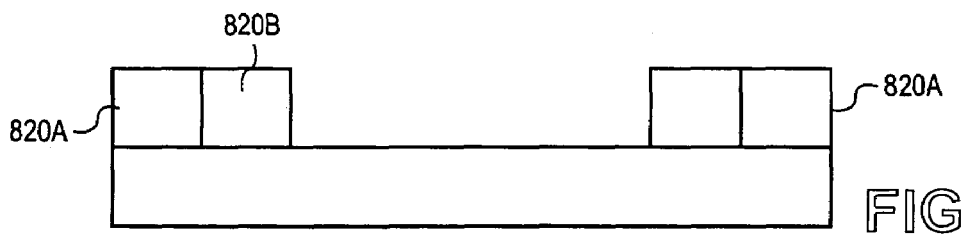
FIG. 14 shows the structure of FIG. 13 following the patterning of the second film.
Figure 15:
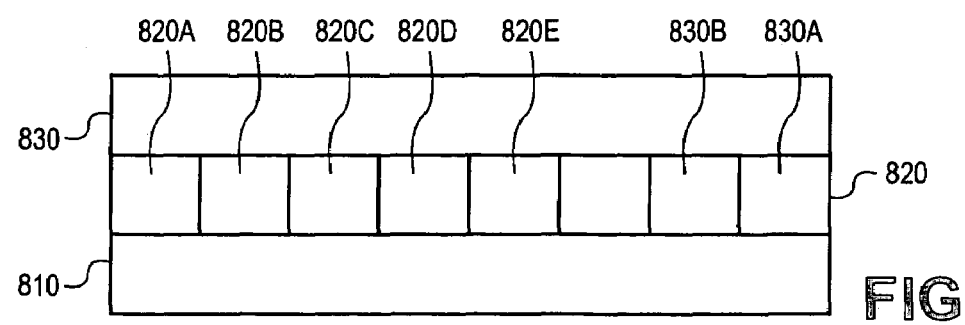
FIG. 15 shows the structure of FIG. 14 following the formation of a composite dielectric and the formation of a second conductor on the composite delectric.

Following the formation of film 820A, a mask may be patterned over film 820A. FIG. 12 shows mask 825 formed over film 820A. FIG. 12 also shows the structure of FIG. 10 following the deposition of material for film 820B. The deposition technique for material for film 820B may be similar to that of a material for film 820A. Following the deposition of a material for film 820B, mask 825 may be removed and a material for film 820B processed to form film 820B as shown in FIG. 13. Film 820B may be patterned as desired using wet etch, dry etch, or laser ablation techniques. FIG. 13 shows a structure having film 820B patterned adjacent film 820A. The masking, deposition/processing, and patterning techniques may be repeated to form a composite film across a width, $W_T$, of first conductor 810. FIG. 14 shows a composite dielectric 820 made up of the individual films. Following the formation of composite dielectric 820, the composite may be exposed to a sintering process such as, for a barium titanate structure, a temperature on the order of 700° C. to 900° C. Following sintering of composite 820, second conductor 830 may be connected (e.g., printed, electroplated) to an exposed surface of composite 820 to form a capacitor substrate.

In the preceding detailed description, reference is made to specific embodiments thereof. It will, however, be evident that various modifications and changes may be made thereto without departing from the broader spirit and scope of the following claims. The specification and drawings are, accordingly, to be regarded in an illustrative rather than a restrictive sense.

What is claimed is:

1. An apparatus comprising:
   a first electrode;
   a second electrode; and
   a composite dielectric comprising a plurality of dielectric films, each of the plurality of dielectric films comprising a different Curie temperature, wherein (i) a surface of each of the plurality of dielectric films is in direct contact with at least one surface of another dielectric film within the composite dielectric and (ii) each of the plurality of dielectric films is comprised of the same general formula with a varying concentration of a dopant corresponding to each of the plurality of dielectric films comprising a different Curie temperature.

2. The apparatus of claim 1, wherein the plurality of dielectric films are arranged so that a total capacitive response of the composite dielectric comprises a series representation of a capacitive response of each of the plurality of dielectric films.

3. The apparatus of claim 1, wherein a Curie temperature of each of the plurality of dielectric films is related to the amount of dopant in the film.

4. The apparatus of claim 1, wherein the general formula is $BaTiO_3$ and the dopant is strontium.

5. The apparatus of claim 1, wherein the plurality of dielectric films are arranged so that a total capacitance of the composite dielectric comprises a parallel representation of a capacitance of the each of plurality of dielectric films.

6. The apparatus of claim 5, wherein those of the plurality of dielectric films having a greater Curie temperature are arranged so that the plurality of dielectric films are in an area of the apparatus that may be subject to greater amounts of heat from an electrical device coupled to the apparatus.

7. An assembly comprising:
   a die;
   a printed circuit board (PCB); and
   a package substrate coupled to the die on a first surface and coupled to the PCB on a second surface, wherein the package substrate comprises at least one capacitor integrated within the package substrate, the at least one capacitor comprising (i) a first electrode, (ii) a second electrode, (iii) a first ceramic material disposed between the first electrode and the second electrode, and (iv) a second ceramic material disposed between the first ceramic material and at least one of the first electrode and the second electrode, the second ceramic material having a greater electrical conductivity than the first ceramic material and comprising a compound of the general formula $La_{1-x}Sr_xMnO_{3-\delta}$ where x is selected from 0 to 0.4.

8. The assembly of claim 7, wherein the second ceramic material is selected from a material having a chemical structure that may be modified to modify an electrical conductivity of the second ceramic material.

9. The assembly of claim 7, wherein the first ceramic material comprises barium strontium titanate.

10. An assembly comprising:
    a die;
    a printed circuit board (PCB); and
    a package substrate coupled to the die on a first surface and coupled to the PCB on a second surface, wherein the package substrate comprises at least one capacitor integrated within the package substrate, the at least one capacitor comprising a (i) first electrode, (ii) a second electrode, and (iii) a composite dielectric comprising a plurality of dielectric films, each of the plurality of dielectric films comprising a different Curie temperature, wherein (a) a surface of each of the plurality of dielectric films is in direct contact with at least one surface of another dielectric film within the composite dielectric and (b) each of the plurality of dielectric films is comprised of the same general formula with a varying concentration of a dopant corresponding to each of the plurality of dielectric films comprising a different Curie temperature.

11. The assembly of claim 10, wherein the plurality of dielectric films are arranged so that a total capacitive response of the composite dielectric comprises a series representation of a capacitive response of each of the plurality of dielectric films.

12. The assembly of claim 10, wherein the plurality of dielectric films are arranged so that a total capacitance of the composite dielectric comprises a parallel representation of a capacitance of the each of plurality of dielectric films.

13. The assembly of claim 12, wherein those of the plurality of dielectric films having a greater Curie temperature are arranged so that the plurality of dielectric films are in an area of the apparatus that may be subject to greater amounts of heat from an electrical device coupled to the apparatus.

14. The assembly of claim 10, wherein a Curie temperature of each of the plurality of dielectric films is related to the amount of dopant in the film.

* * * * *